(12) United States Patent
Drazan (10) Patent No.: US 8,593,151 B2
(45) Date of Patent: Nov. 26, 2013

(54) INDUCTIVE MONITORING OF A POWER TRANSMISSION LINE OF AN ELECTRICAL NETWORK

(76) Inventor: Jeffrey M Drazan, Woodside, CA (US)

( * ) Notice: Subject to any disclaimer, the term of this patent is extended or adjusted under 35 U.S.C. 154(b) by 450 days.

(21) Appl. No.: 13/036,028

(22) Filed: Feb. 28, 2011

(65) Prior Publication Data

US 2012/0217975 A1 Aug. 30, 2012

(51) Int. Cl.
*G01R 31/08* (2006.01)
*G06F 19/00* (2011.01)

(52) U.S. Cl.
USPC ............................................ 324/522; 702/61

(58) Field of Classification Search
USPC .......... 324/522, 512, 500, 142, 140 R, 76.11, 324/156, 157; 702/57, 60, 61, 62; 340/870.01, 870.02
See application file for complete search history.

(56) References Cited

U.S. PATENT DOCUMENTS

| | | | |
|---|---|---|---|
| 7,979,221 B2* | 7/2011 | Gilbert et al. | 702/61 |
| 2011/0045786 A1* | 2/2011 | Leinonen et al. | 455/78 |

\* cited by examiner

*Primary Examiner* — Hoai-An D Nguyen
(74) *Attorney, Agent, or Firm* — Raj Abhyanker, P.C.

(57) ABSTRACT

A method includes inductively coupling an electrical sensor to a transmission line associated with a node of an electrical network, and capturing power transmission information associated with the node through the electrical sensor. The method also includes communicating, through an electrical sensing device including the electrical sensor, information associated with a location of a power outage and/or a sub-optimal performance in the node to a processing node and/or a central control node associated with the electrical network.

29 Claims, 8 Drawing Sheets

INDUCTIVE MONITORING OF A POWER TRANSMISSION LINE OF AN ELECTRICAL NETWORK

FIELD OF TECHNOLOGY

This disclosure relates generally to electrical network(s) and, more particularly, to a method, an apparatus, and/or a system of inductive monitoring of a power transmission line of an electrical network.

BACKGROUND

When a service interruption occurs, a utility company may deploy resources (e.g., specialized personnel, instruments, etc.) to determine a cause that contributes thereto. The service interruption (e.g., a power outage, a surge, etc.) can create severe risks (e.g., security, financial, hazard, customer satisfaction) that the utility company may wish to avoid. It may take many hours before an accurate location of a contributing factor to the service interruption is determined. As a result, the utility company may be exposed to prolonged risks that adversely affect operations thereof.

SUMMARY

Disclosed are a method, an apparatus, and/or a system of inductive monitoring of a power transmission line of an electrical network.

In one aspect, a method includes inductively coupling an electrical sensor to a transmission line associated with a node of an electrical network, and capturing power transmission information associated with the node through the electrical sensor. The method also includes communicating, through an electrical sensing device including the electrical sensor, information associated with a location of a power outage and/or a sub-optimal performance in the node to a processing node and/or a central control node associated with the electrical network.

In another aspect, an electrical network includes a number of nodes, a number of processing nodes and a central control node. Each node of the number of nodes includes a transmission line and an electrical sensing device inductively coupled to the transmission line. The electrical sensing device is configured to capture power transmission information associated with the node, and the electrical sensing device includes an electrical sensor and a wireless location sensor associated therewith to transmit a location information associated with the node and/or a location information of the electrical sensing device.

A power outage and/or a sub-optimal performance in the electrical network is localized to a location within a node of the number of nodes based on the power transmission information captured through the electrical sensing device and the location information transmitted by the electrical sensing device in the each node of the number of nodes to a processing node and/or the central control node.

In yet another aspect, an electrical sensing device includes an electrical sensor configured to be inductively coupled to a transmission line associated with a node of an electrical network, and to capture power transmission information associated with the node. The electrical sensing device also includes a wireless location sensor configured to capture a location information associated with the node. The electrical sensing device is configured to communicate information associated with a location of a power outage and/or a sub-optimal performance in the node to a processing node and/or a central control node associated with the electrical network.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be directed to a method, an apparatus and/or a system of inductive monitoring of a power transmission line of an electrical network. Although the present embodiments have been described with reference to specific example embodiments, it will be evident that various modifications and changes may be made to these embodiments without departing from the broader spirit and scope of the various embodiments.

Figure 1:
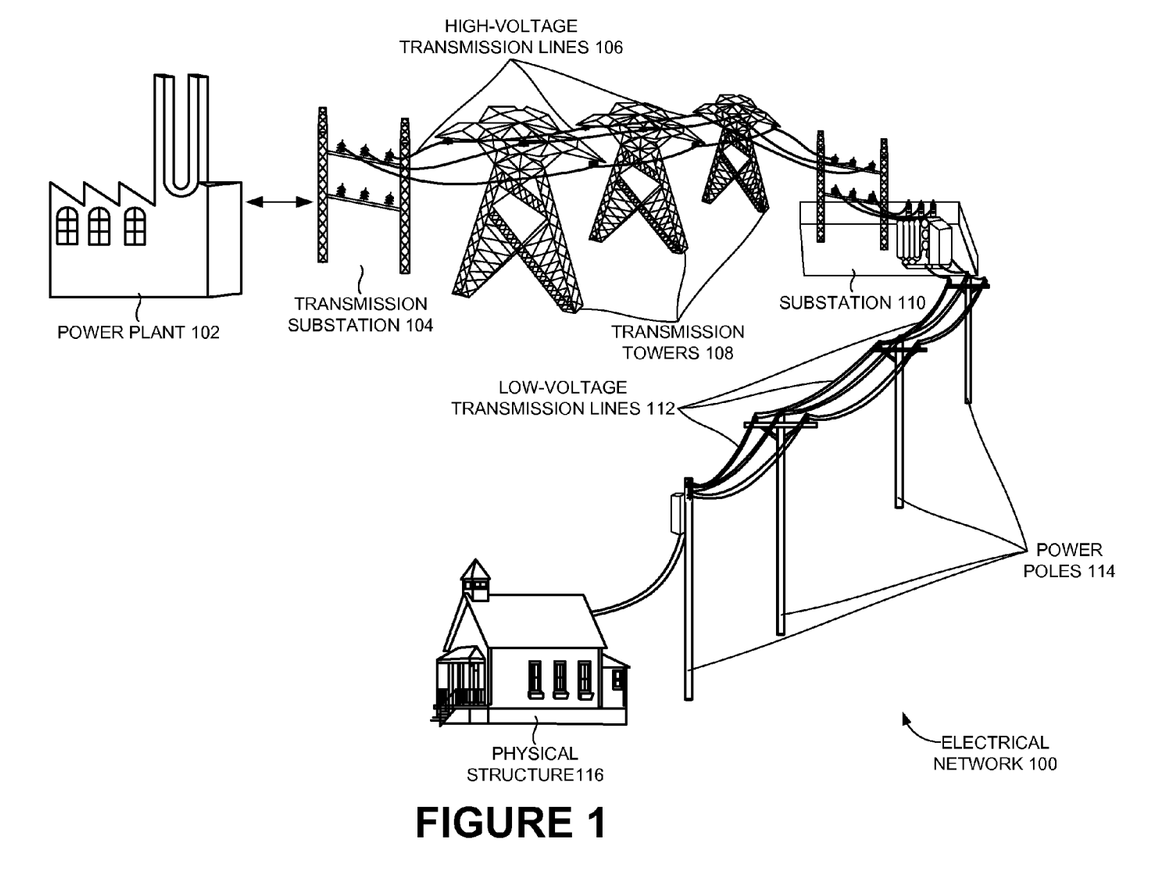
FIG. 1 is a schematic view of an electrical network, according to one or more embodiments.

FIG. 1 shows an electrical network 100 (e.g., a power grid), according to one or more embodiments. In one or more embodiments, electrical network 100 may include a power plant 102 configured to be the "power source" thereof. For example, power plant 102 may be a nuclear power station, a hydroelectric power station, a gas turbine based power station or a fuel (e.g., fossil fuel, biomass fuel) based power station. In one or more embodiments, power plant 102 may have a transmission substation 104 associated therewith. In one or more embodiments, transmission substation 104 may include transformers (not shown) to convert voltage (e.g., Alternating Current (AC) voltage) generated by power plant 102 into an appropriate voltage for long distance transmission (e.g., over high-voltage transmission lines 106). In one or more embodiments, the aforementioned high-voltage transmission lines 106 may be supported by transmission towers 108 (e.g., made of steel), which facilitate transport of power from power plant 102 to a substation 110 configured to enable distribution of the power.

In one or more embodiments, in order to facilitate power distribution, substation 110 may include transformer(s) (not shown) configured to step down the transmission voltage to distribution voltage(s) (e.g., <10,000 volts (V)). It is obvious that substation 110 may have a bus (not shown) associated therewith configured to enable splitting of the power distribution in accordance with requirements. In one example embodiment, substation 110 may be configured to handle multiple sets of distribution lines at different voltages by way of the aforementioned bus. In one or more embodiments, low-voltage transmission lines 112 may be configured to carry power to be distributed to physical structure(s) (e.g., buildings including but not limited to residential homes, apartments, offices, commercial establishments, non-commercial establishments). In one or more embodiments, power poles 114 (e.g., made of wood, steel) may be configured to support the aforementioned low-voltage transmission lines 112, analogous to high-voltage transmission lines 106 being supported by transmission towers 108.

In one or more embodiments, power poles 114 may have taps (not shown) associated therewith to distribute the power carried by low-voltage transmission lines 112 to individual physical structure(s). For example, the aforementioned tap(s) may enable wires associated with one or two phases to distribute power to individual physical structure(s), when low-voltage transmission lines 112 are associated with three-phase power. In an example embodiment, a power pole 114 may have a transformer associated therewith to convert power (e.g., 7200 V) into a level (e.g., 120 V, 240 V) compatible with electrical appliance(s) associated with the physical structure (s). In another example embodiment, the aforementioned transformer may be on a separate pole that receives power at one level and enables distribution of power at a level compatible with the electrical appliance(s).

In one example embodiment, the transformer associated with power pole 114 may include a center-tapped secondary to enable split-phase service. In one or more embodiments, power pole 114 may be associated with power distribution (e.g., after transforming voltage carried by low-voltage transmission lines 112 into appropriate levels) from substation 110 to one or more physical structure(s) (e.g., physical structure 116) by way of electrical lines. It is obvious that electrical network 100 may have a number of substations analogous to substation 110 and that each local substation (e.g., substation 110) may cater to a number of physical structure(s) (e.g., physical structure 116). FIG. 1 shows one substation (e.g., substation 110) and one physical structure (e.g., physical structure 116) merely for the sake of convenience.

In one or more embodiments, when there is a local/"global" power outage and/or a sub-optimal performance in electrical network 100 due to one or more faulty transmission line(s) and/or equipment associated with power poles 114, transmission towers 108 and/or substation 110, there may be a long time delay prior to a localized detection of the aforementioned fault(s). The aforementioned time delay may be dependent on resources (e.g., specialized personnel, instruments) deployed for the detection and the time taken to localize the fault(s).

Figure 2:
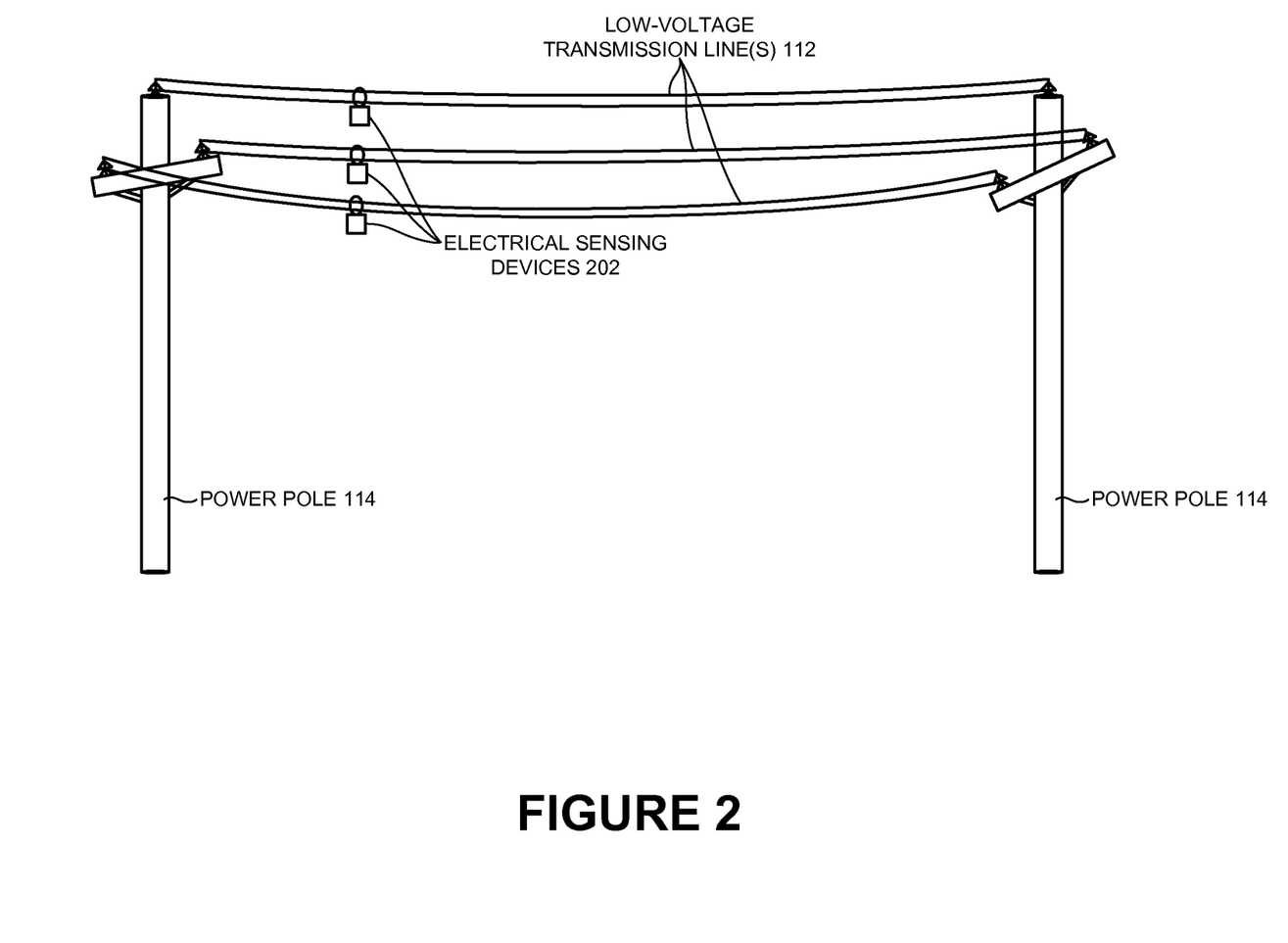
FIG. 2 is a schematic view of a set of low-voltage transmission lines of the electrical network of FIG. 1 coupled to electrical sensing device(s), according to one or more embodiments.

FIG. 2 shows a set of low-voltage transmission lines 112 coupled to electrical sensing device(s) 202, according to one or more embodiments. In one example embodiment, each electrical sensing device 202 may be associated with a corresponding low-voltage transmission line 112 through a suspension thereof on the corresponding low-voltage transmission line 112. The aforementioned electrical sensing device 202 may be provided proximate power pole 114 associated with low-voltage transmission line 112. It is obvious that the power pole succeeding power pole 114 may have a set of low-voltage transmission lines (e.g., a continuation of low-voltage transmission line 112) associated therewith. Further, it is obvious that electrical sensing device(s) 202 may also be coupled to high-voltage transmission lines 106 having transmission towers 108 associated therewith. FIG. 2 shows low-voltage transmission lines 112 (and power pole 114) merely for the sake of illustration of the concepts involved herein.

In one or more embodiments, the aforementioned electrical sensing device(s) 202 may be configured to detect a fault and/or a sub-optimal performance in a node including the set of low-voltage transmission lines 112 and power pole 114, the node being part of electrical network 100. In one example embodiment, electrical sensing device(s) 202 may be part of the node. In one or more embodiments, each electrical sensing device 202 may detect the fault and/or the sub-optimal performance based on the Faraday Effect. In accordance with the Faraday Effect, when light is transmitted through a medium parallel to a magnetic field, a plane of polarization thereof is rotated. In one or more embodiments, winding an appropriate material (e.g., fiber) around a conductor associated with low-voltage transmission lines 112 such that the aforementioned light propagates in a direction parallel to the magnetic field due to the current in the conductor may result in the capability to sense the current based on the measurable rotation proportional thereto.

Figure 3:
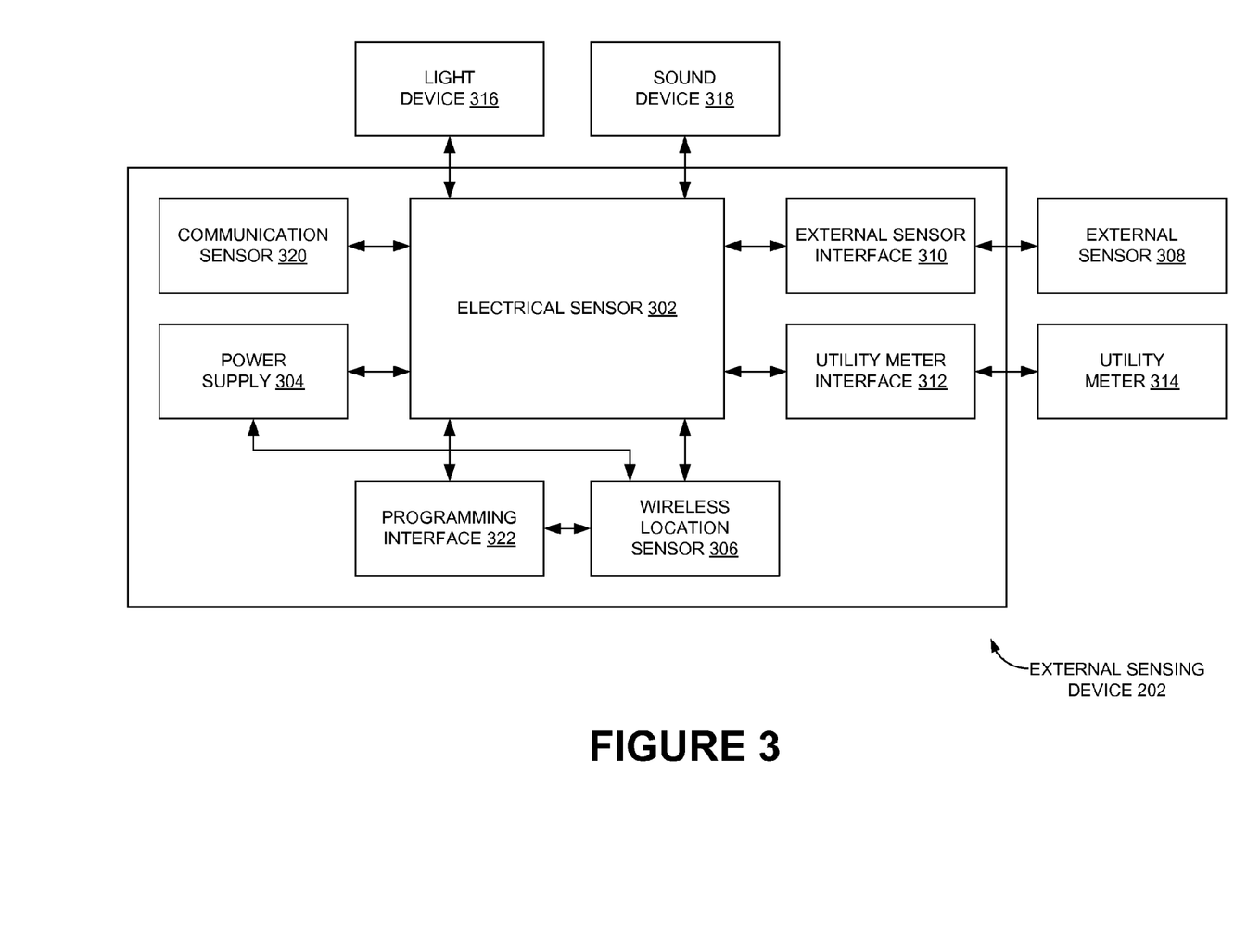
FIG. 3 is a schematic view of an electrical sensing device of FIG. 2, according to one or more embodiments.

The Faraday Effect (and sensing utilizing the effect) is well known to one skilled in the art. Therefore, discussion associated therewith has been skipped for the sake of convenience. It is obvious that any method of sensing the fault and/or the sub-optimal performance of the node of electrical network 100 is within the scope of the exemplary embodiments. FIG. 3 shows a block diagram of electrical sensing device 202, according to one or more embodiments. In one or more embodiments, electrical sensing device 202 may include an electrical sensor 302 configured to be inductively coupled to a transmission line (e.g., low-voltage transmission line 112, high-voltage transmission line 106) associated with the node (as discussed above) of electrical network 100. In one or more embodiments, thus, in one or more embodiments, electrical sensor 302 and/or electrical sensing device 202 may be configured to be powered through the transmission line.

For example, electrical sensing device 202 and/or electrical sensor 302 may include an inductive element configured to have an induced voltage thereacross due to a change in the current carried by the transmission line, which may power electrical sensing device 202 and/or electrical sensor 302. In one or more embodiments, electrical sensing device 202 and/or electrical sensor 302 may also be powered through a power supply 304 associated therewith. In one or more embodiments, power supply 304 may be a battery that may be recharged, again, by the inductive powering thereof through transmission line (e.g., low-voltage transmission line 112). Other forms of powering electrical sensing device 202 and/or electrical sensor 302 (e.g., solar, wind, internal/external power supply) are also within the scope of the exemplary embodiments.

In one or more embodiments, electrical sensing device 202 (e.g., by way of electrical sensor 302) may be configured to capture power transmission information associated with the node. In one or more embodiments, the power transmission information may include a current data, a voltage data, an oscillation (e.g., power oscillation) data, a surge data and/or a phase data. In one or more embodiments, electrical sensing device 202 or electrical sensor 302 may have a processor (not shown) associated therewith for converting data obtained through electrical sensor 302 into the aforementioned power transmission information. In one or more embodiments, the processor may be external to electrical sensing device 202.

In one or more embodiments, a fault and/or a sub-optimal performance may cause a change in a parameter sensed through electrical sensor 302. In one or more embodiments, the aforementioned change may be translated to a change in the power transmission information captured through electrical sensing device 202. In one or more embodiments, depending on the change in the power transmission information, the fault and/or a sub-optimal performance of the node may be localized therein. In one or more embodiments, electrical sensor 302 may be configured to transmit a location information of the fault (e.g., power outage) and/or the sub-optimal performance associated with the node to a processing node (e.g., a computer server) and a central control node (e.g., a computer server) associated with electrical network 100. In one or more embodiments, a processing node may be closer to the node including electrical sensing device 202 and the transmission line to which electrical sensing device 202 is coupled than the central control node. For example, the processing node may be local to the node including electrical sensing device 202 and the transmission line associated therewith, and the central control node may be a management node of electrical network 100 to which the processing node (and/or electrical sensing device 202) may communicate information.

In one or more embodiments, when power fails on the transmission line, electrical sensing device 202 may be configured to revert to power supply 304 (e.g., battery) for power. Thus, in one or more embodiments, electrical sensing device 202 may be configured to transmit a signal associated with the outage (and/or sub-optimal performance) to the processing node and/or the central control node by being powered through power supply 304.

It is obvious that electrical network 100 may include a number of processing nodes, each of which may be local to a region of electrical network 100. In one or more embodiments, electrical sensing device 202 (or, electrical sensor 302) may be configured to communicate the abovementioned location information to the processing node associated therewith and/or the central control node of electrical network 100. In one or more embodiments, electrical sensing device 202 (or, electrical sensor 302) may also be configured to communicate the power transmission information periodically/continuously/when queried to the processing node and/or the central control node.

In one or more embodiments, in order for electrical sensing device 202 (or, electrical sensor 302) to transmit information associated with the location of the fault and/or the sub-optimal performance in the node, electrical sensing device 202 may include a wireless location sensor 306. In one or more embodiments, wireless location sensor 306 may be associated with electrical sensor 302 either by way of being provided as part of electrical sensor 302 or by way of being distinct from electrical sensor 302. In one or more embodiments, the fault and/or the sub-optimal performance may be detected through electrical sensor 302 based on an anomaly observed in the node. In one or more embodiments, as power transmission through a transmission line is distance (or, length) dependent, power transmission data from electrical sensor 302 may be also utilized (e.g., through the processor discussed above) to estimate location information.

Also, in one or more embodiments, wireless location sensor 306 may be a Global Positioning System (GPS) based sensor and, may communicate (or, aid in the communication through electrical sensing device 202 or electrical sensor 302) the location information (e.g., geospatial coordinate(s)) of the fault and/or the sub-optimal performance to the processing node and/or the central control node of electrical network 100. In one or more embodiments, the utilization of a GPS based sensor in conjunction with electrical sensor 302 may lead to the location of an event (e.g., fault, sub-optimal performance) associated with the node of electrical network 100 being determined accurately (e.g., within a distance of at most 5 meters). Here, the distance between successive power poles 114 may be, for example, <100 meters.

It is obvious that wireless location sensor 306 may be based on other signal triangular methods such as cellular communication. Variations in implementation associated with wireless location sensor 306 are within the scope of the exemplary embodiments. Also, in one or more embodiments, electrical sensing device 302 may include wireless radio (e.g., WiFi™, Worldwide Interoperability for Microwave Access (WiMax™)) compatibility in order to enable transmission of information to the processing node and/or the central control node.

In one or more embodiments, the aforementioned localization of the fault and/or the sub-optimal performance may convenience quick addressing of problems associated therewith. In one or more embodiments, electrical sensing device 202 may be configured to be capable of processing an input from an external sensor 308, along with data from electrical sensor 302. Here, in one or more embodiment, external sensor 308 may be any other remote sensor associated with the node, a local sensor associated with the node or part of a set of sensors (other than electrical sensor 302 and wireless location sensor 306, of course) associated with the node. Examples of external sensor 308 include but are not limited to a temperature sensor, a pressure sensor and an audio sensor. In an example embodiment, data from external sensor 308 may be leveraged/used to characterize the fault and/or the sub-optimal performance location within the node.

In one or more embodiments, electrical sensing device 202 (or, electrical sensor 302) may have an external sensor interface 310 in order for external sensor 308 to be coupled thereto. In one or more embodiments, electrical sensing device 202 (or, electrical sensor 302) may also have a utility meter interface 312 configured to receive an input from a utility meter 314 associated with the node. In one or more embodiments, electrical sensing device 202 may then be configured to analyze the output from utility meter 314 for power consumption associated with the node (or, power consumption associated with another node) and other useful data. In one or more embodiments, electrical sensing device 202 may be configured to capture an audio data, an image data and/or a video data associated with the environment of the node associated with the transmission line and electrical sensing device 202. In one or more embodiments, electrical sensing device 202 may also have the capability to receive any other appropriate data (e.g., for data consolidation) associated with other nodes may also.

In one or more embodiments, a condition information associated with the node (e.g., the transmission line) of electrical network 100 may be determined through electrical sensing device 202. In one or more embodiments, the condition information may include information associated with a fault condition and/or a sub-optimal performance condition. In one or more embodiments, following the determination of the condition information, electrical sensing device 202 (e.g., through electrical sensor 302) may be configured to activate (e.g., through the processor discussed above) a light device (e.g., light device 316) and/or a sound device (e.g., sound device 318) to indicate the aforementioned fault condition and/or sub-optimal performance condition. Although light device 316 and/or sound device 318 may be optional, they are shown in FIG. 3 in order to demonstrate the capabilities of the exemplary embodiments.

In one or more embodiments, status information received from and associated with one or more other sensors proximate or remote from electrical sensing device 202 may be utilized to obtain condition information associated with the environment and/or electrical network 100. In one example embodiment, the status information associated with the one or more other sensors may be analyzed to activate light device 316 and/or sound device 318. In one or more embodiments, electrical sensing device 202 may be configured to transmit location information (e.g., location of the fault and/or the sub-optimal performance, location information associated with electrical sensing device 202 during regular operation) associated with the node when queried externally. Alternately, in one or more embodiments, electrical sensing device 202 may be configured to transmit the aforementioned location information when an appropriate communication sensor 320 is activated. A switch or a touch sensor may be an example of communication sensor 320.

Thus, in one example embodiment, electrical sensing device 202 (or, electrical sensor 302) may be configured to transmit a signal to the processing node and/or the central control node of electrical network 100 that has the capability to identify the location of electrical sensing device 202 on a map. In another example embodiment, the location reporting may be initiated through pressing the switch or the touch sensor on electrical sensing device 202. In yet another example embodiment, a signal may be transmitted from the processing node or the central control node to turn on light device 316 and/or sound device 318 for a specified period of time.

In one or more embodiments, electrical sensing device 202 may incorporate an identity feature to enable unique identification thereof. In one or more embodiments, the unique identification data (e.g., alphanumeric, hexadecimal and/or other coding sequence of fixed/variable length) of electrical sensing device 202 may be electronically hard-coded into a data bank thereof. In one or more embodiments, electrical sensing device 202 may be configured to communicate with the processing node and/or the central control node based on the unique identification data. In one example embodiment, electrical sensing device 202 may be programmed with the unique identification data. Thus, in one or more embodiments, electrical sensing device 202 may have a programming interface 322 to enable the programming thereof. In one or more embodiments, the programming of electrical sensing device 202 may be performed in a wired manner or a wireless manner.

In one or more embodiments, purposes of the programming may include but are not limited to calibrating electrical sensing device 202, assigning the unique identification data discussed above and/or setting operational parameters. For example, electrical sensing device 202 may also be programmed to sense power transmission information continuously, periodically and/or at different time intervals. Other appropriate functionalities associated with programming interface 322 are within the scope of the exemplary embodiments. In one or more embodiments, the power transmission information and/or the location information may be transmitted periodically or immediately to the processing node and/or the central control node.

Figure 4:
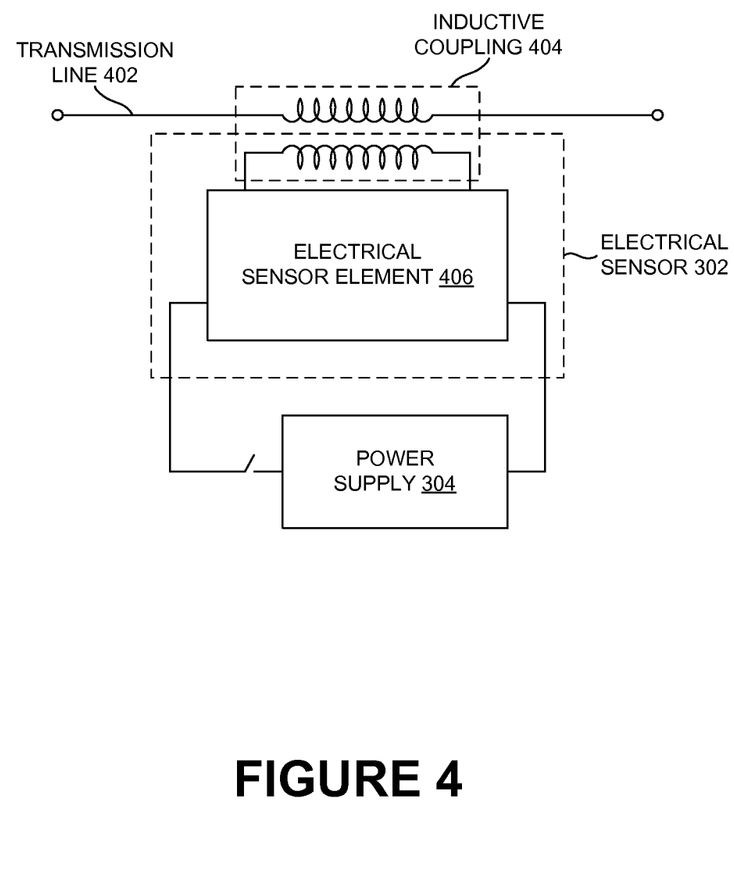
FIG. 4 is a circuit diagram of a transmission line of FIG. 1 interfaced with the electrical sensing device of FIG. 3, according to one or more embodiments.

FIG. 4 shows a circuit diagram of a transmission line 402 (e.g., low-voltage transmission line 112, high-voltage transmission line 106) interfaced with electrical sensing device 202, according to one or more embodiments. In one or more embodiments, as discussed above, transmission line 402 may be inductively coupled (e.g., through inductive coupling 404) to electrical sensing device 202 (or, electrical sensor 302). In one or more embodiments, electrical sensor 302 may include an electrical sensor element 406, which is powered on through inductive coupling 404, as shown in FIG. 4. In one or more embodiments, electrical sensor device 202 (and/or electrical sensor 302) may also be powered through power supply 304, as shown in FIG. 4.

Figure 5:
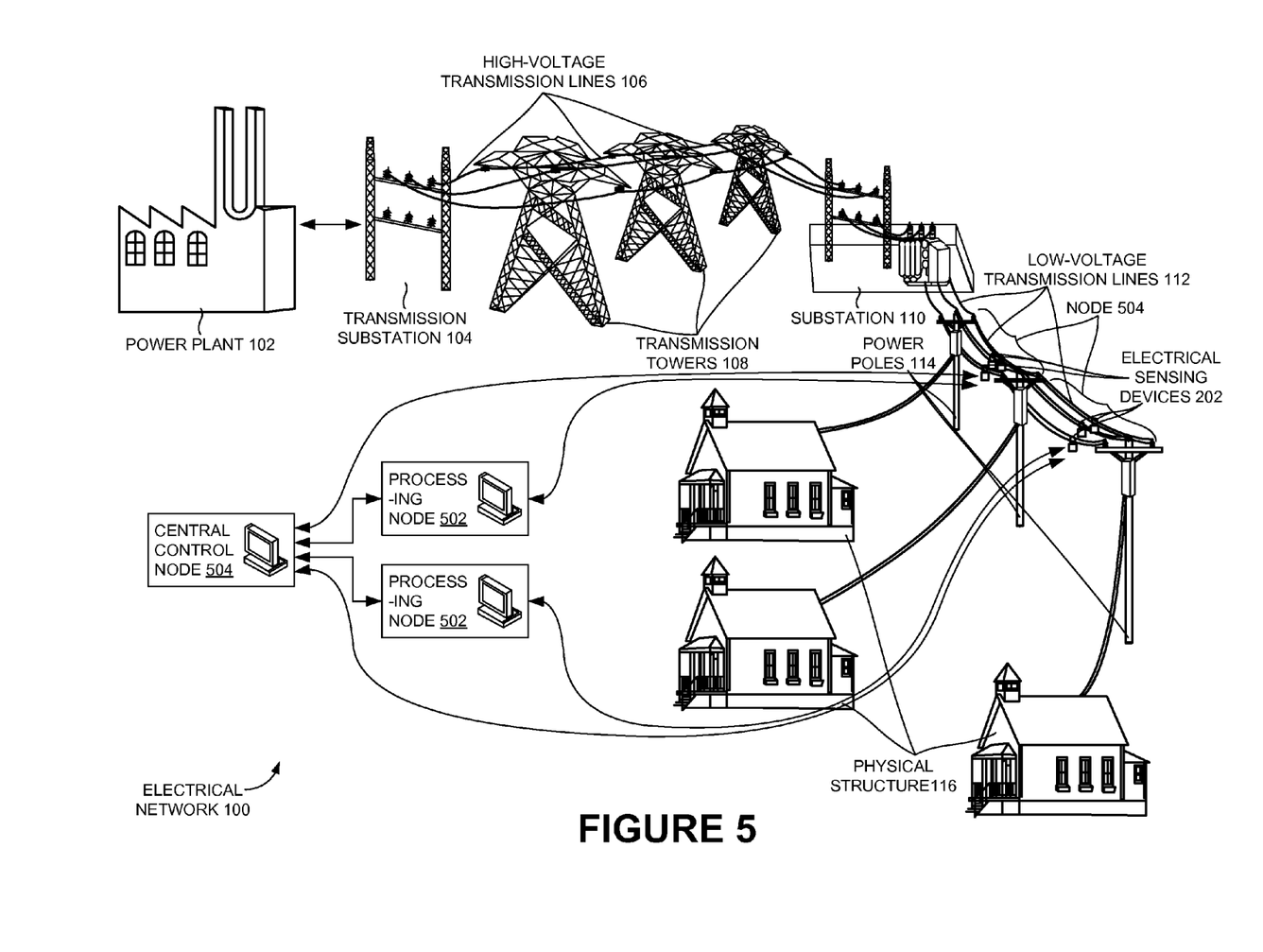
FIG. 5 is a schematic view of the electrical network of FIG. 1 with a number of processing nodes and a central control node, according to one or more embodiments.

FIG. 5 shows electrical network 100 with a number of processing nodes 502 (e.g., two nodes 502) and a central control node 506, according to one or more embodiments. In one or more embodiments, each of the number of processing nodes 502 may be associated with power distribution to one or more physical structure(s) (e.g., physical structure 116 for illustrative convenience). In the example embodiment shown in FIG. 5, each processing node 502 is associated with a node 504 of electrical network 100. For example, each node 504 may include transmission line 402 (which, in turn, may be a plurality), electrical sensing device 202 and a power pole 114. In one or more embodiments, processing nodes 502 may be configured to communicate with central control node 506 (see discussion associated therewith above) of electrical network 100 to report information/data associated with the respective nodes 504 thereto. In the example embodiment shown in FIG. 5, processing nodes 502 and central control node 506 may be configured to communicate through a computer network (not shown; e.g., Local Area Network (LAN), Wide Area Network (WAN), Internet).

In one or more embodiments, processing nodes 502 and/or central control node 506 may be computer servers. In one or more embodiments, each of the processing nodes 502 and/or central control node 506 may enable the information sensed through electrical sensing device 202 to be processed further, forwarded, transmitted, displayed, stored and/or reported. Discussions associated with processing nodes 502 and/or central control node 506 have been skipped for the sake of avoiding repetition and one is referred to the discussion associated with FIGS. 1-4 therefor. FIG. 5 shows one physical structure 116 per node 504 for the sake of illustrative convenience.

Figure 6:
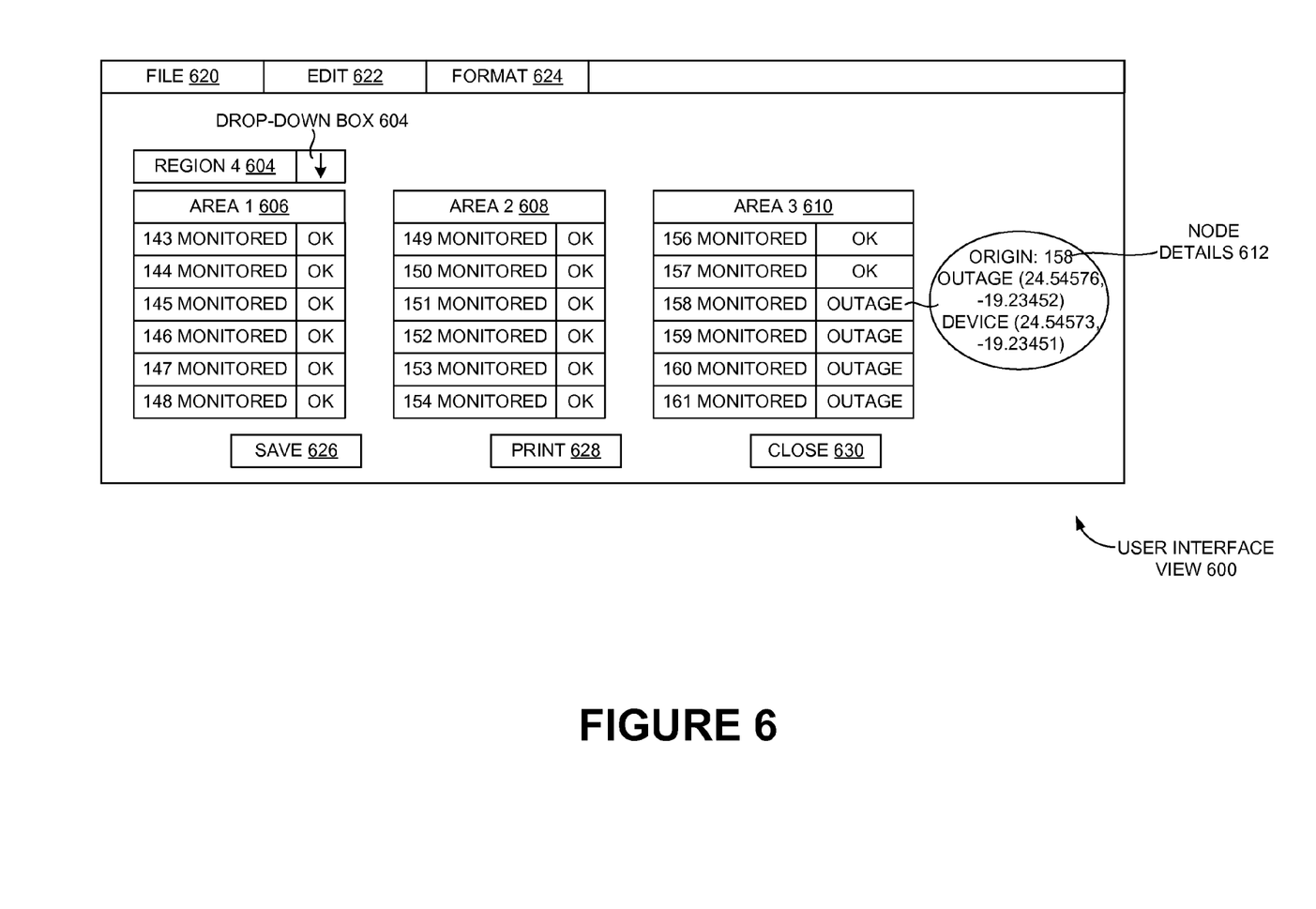
FIG. 6 is a user interface view of the central control node and/or a processing node of FIG. 5, according to one or more embodiments.

FIG. 6 shows a user interface view 600 of central control node 506 (and/or processing node 502) associated with electrical network 100 including a number of electrical sensing devices 202 in each node 504 thereof, according to one or more embodiments. In one or more embodiments, user interface view 600 may include power transmission status in areas of a region (e.g., region 4 602) within a city covered by electrical network 100. In one or more embodiments, a specific region (e.g., region 4 602) may be selected from a drop-down box 604 in user interface view 600. In the example embodiment shown in FIG. 6, region 4 602 may be subdivided into area 1 606, area 2 608 and area 3 610. As shown in FIG. 6, area 1 606 may include node numbers 143-148, area 2 608 may include node numbers 149-155, and area 3 610 may include node numbers 156-161.

FIG. 6 shows the nodes in area 1 606, area 2 608 and area 3 610 being monitored. The status of all nodes in area 1 606 and area 2 608 is shown as "OK," implying that normal power transmission/distribution is occurring. The status of nodes 158-161 corresponding to area 3 610 is shown as being shown as "OUTAGE," implying that there is a power outage in the nodes corresponding to the aforementioned node numbers. The status associated with other node numbers, viz. node numbers 156-157, of area 3 610 is, again, shown as "OK." When a cursor is brought over the virtual representation of the node numbers 158-161 within area 3 610, details (e.g., node details 612) corresponding to the power outage associated with the aforementioned nodes may be obtained. For example, as shown in FIG. 6, node details 612 may include the node number to which the origin of the power outage is traced. FIG. 6 shows that the origin of the power outage is node number 158, the approximate coordinates of the power outage is (24.54576, −19.23452), and the approximate coordinates of electrical sensing device 202 corresponding to the node number 158 is (24.54573, −19.23451).

User interface 100 also includes control option buttons such as File 620 (e.g., to open new file, save file), Edit 622 (e.g., edit views, edit data), Format 624 (e.g., format text view), Save 626 (e.g., save page, save data), Print 628 (e.g., print page) and Close 630 (e.g., close page). It is obvious that other implementations of user interface 100 and variations thereof to suit volume of data, analysis requirements and/or readability are within the scope of the exemplary embodiments.

To summarize, in one or more embodiments, the provision of electrical sensing device(s) 202 (and, electrical sensor 302) in each node 504 of electrical network 100 may provide for localization of a fault and/or a sub-optimal performance therein. In one or more embodiments, the aforementioned localization may lead to a utility company having the capability to address the problems associated therewith quickly and efficiently. In one or more embodiments, if required, the right number of personnel may be deployed at the right location in electrical network 100 to address the problems. In one or more embodiments, remote management/addressing of problems associated with the fault condition and/or the sub-optimal performance may be enabled in electrical network 100 of FIG. 5.

Figure 7:
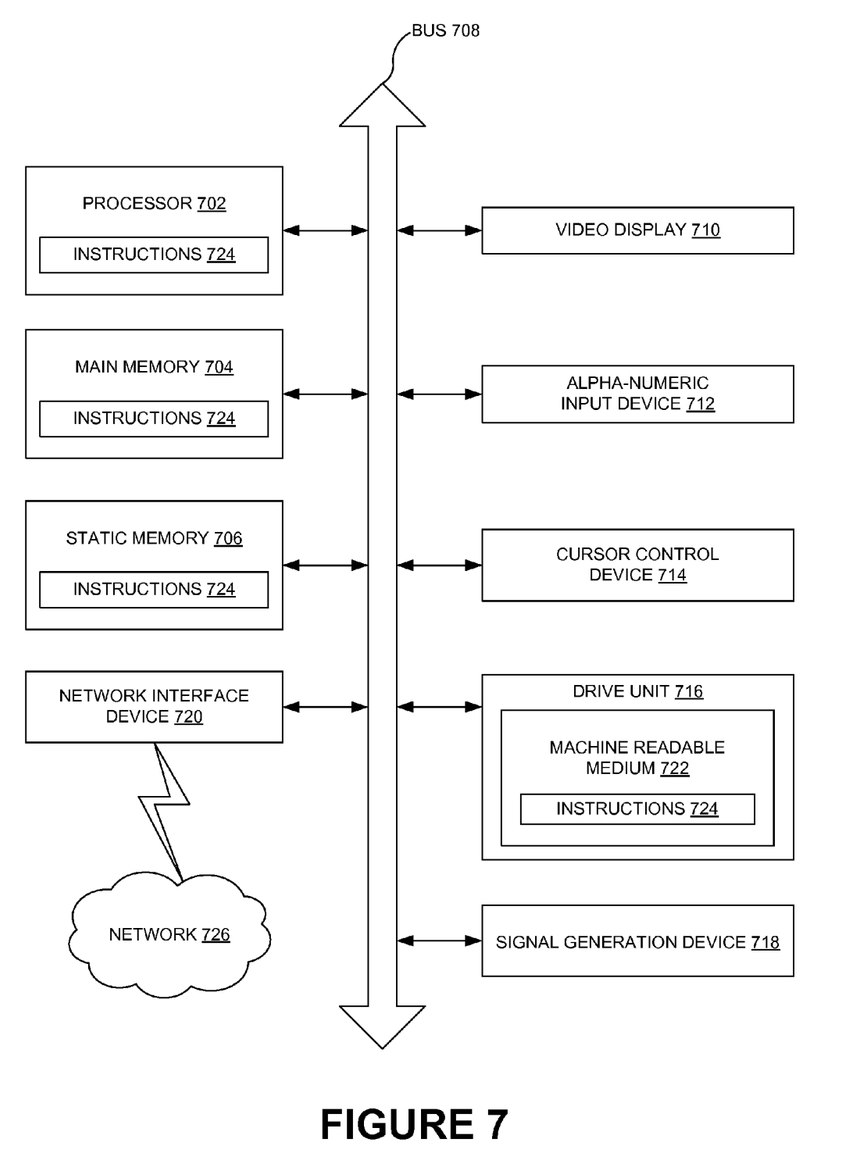
FIG. 7 is a system view of the processing node and/or the central control node of FIG. 5, according to one or more embodiments.

FIG. 7 shows a system view of processing node 502 and/or central control node 506, according to one or more embodiments. In one or more embodiments, as discussed above, processing node 502 and/or central control node 506 may be associated with a personal computer and/or a data processing system in which one or more operations disclosed herein (e.g., with respect to obtaining node information of electrical network 100) are performed. In one or more embodiments, processor 702 shown in FIG. 7 may be a microprocessor, a state machine, an application specific integrated circuit, a field programmable gate array, etc. (e.g., Intel® Pentium® processor). In one or more embodiments, main memory 704 may be a dynamic Random Access Memory (RAM) and/or a primary memory of a computer system.

In one or more embodiments, static memory 706 may be a hard drive, a flash drive and/or other memory information associated with the data processing system. In one or more embodiments, bus 708 may be an interconnection between various circuits and/or structures of the data processing system. In one or more embodiments, video display 710 may provide graphical representation of information on the data processing system. In one or more embodiments, alpha-numeric input device 712 may be a keypad, a keyboard and/or any other input device of text (e.g., a special device to aid the physically handicapped).

In one or more embodiments, cursor control device 714 may be a pointing device such as a mouse. In one or more embodiments, drive unit 716 may be the hard drive, a storage system, and/or another long term storage subsystem. In one or more embodiments, signal generation device 718 may be a BIOS and/or a functional operating system of the data processing system. In one or more embodiments, network interface device 720 may be a device that performs interface functions such as code conversion, protocol conversion and/or buffering required for communication to and from network 726. In one or more embodiments, machine-readable medium 722 may provide instructions on which any of the operations disclosed herein may be performed. In one or more embodiments, instructions 724 may provide source code and/or data code to processor 702 to enable any one or more operations disclosed herein.

Figure 8:
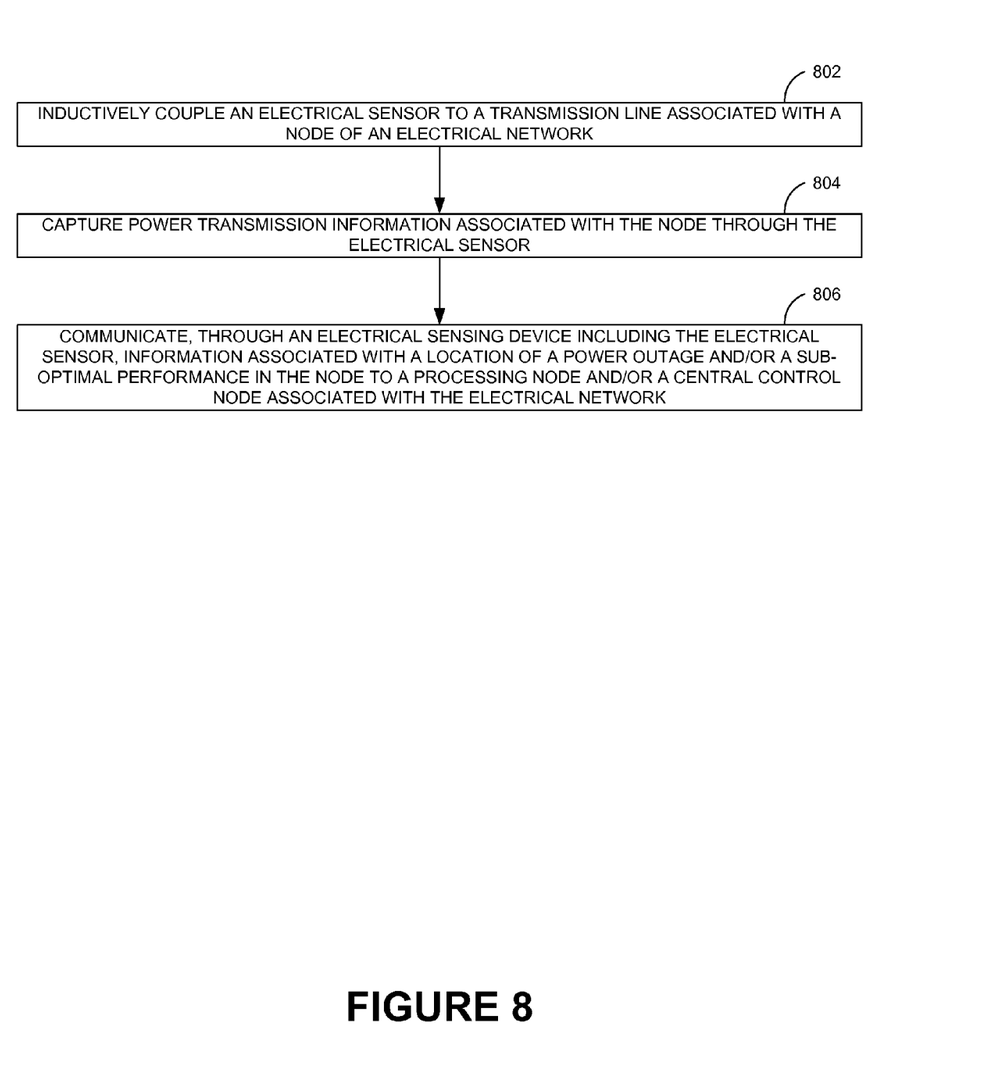
FIG. 8 is a process flow diagram detailing the operations involved in a method of inductive monitoring of a transmission line in the electrical network of FIG. 5, according to one or more embodiments.

FIG. 8 shows a process flow diagram detailing the operations involved in a method of inductive monitoring of a transmission line (e.g., low-voltage transmission line 112) in an electrical network 100, according to one or more embodiments. In one or more embodiments, operation 802 may involve inductively coupling an electrical sensor 302 to the transmission line associated with a node 504 of electrical network 100. In one or more embodiments, operation 804 may involve capturing power transmission information associated with node 504 through electrical sensor 302. In one or more embodiments, operation 806 may then involve communicating, through an electrical sensing device 202 including electrical sensor 302, information associated with a location of a power outage and/or a sub-optimal performance in node 504 to a processing node 502 and/or a central control node 506 associated with electrical network 100.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware circuitry (e.g., CMOS based logic circuitry), firmware, software or any combination of hardware, firmware, and software (e.g., embodied in a machine readable medium).

In addition, it will be appreciated that the various operations, processes, and methods disclosed herein may be embodied in a machine-readable medium and/or a machine accessible medium compatible with a data processing system (e.g., a computer device), and may be performed in any order (e.g., including using means for achieving the various operations). Accordingly, the specification and drawings are to be regarded in an illustrative rather than a restrictive sense.

What is claimed is:

1. A method comprising:
   inductively coupling an electrical sensor to a transmission line associated with a node of an electrical network;
   capturing power transmission information associated with the node through the electrical sensor; and
   communicating, through an electrical sensing device including the electrical sensor, information associated with a location of at least one of a power outage and a sub-optimal performance in the node to at least one of a processing node and a central control node associated with the electrical network.

2. The method of claim 1, further comprising obtaining the information associated with the location of the at least one of the power outage and the sub-optimal performance in the node through a wireless location sensor of the electrical sensing device.

3. The method of claim 1, further comprising powering the electrical sensor through at least one of the inductive coupling thereof to the transmission line and a power supply associated therewith.

4. The method of claim 1, wherein the power transmission information captured through the electrical sensor is associated with at least one of a current data, a voltage data, an oscillation data, a surge data, and a phase data.

5. The method of claim 1, further comprising configuring the electrical sensor to be capable of at least one of:
processing an input from an external sensor to the electrical sensor;
analyzing an input from a utility meter; and
capturing at least one of an audio data, an image data and a video data associated with an environment proximate the node.

6. The method of claim 1, further comprising at least one of:
determining, through the electrical sensor, a condition information associated with the node;
analyzing, through the electrical sensor, status information received from and associated with at least one external sensor in proximity thereto; and
activating, through the electrical sensor, at least one of a light device and a sound device associated with at least one of the condition information of the node and the at least one external sensor.

7. The method of claim 1, further comprising one of periodically and continuously transmitting at least a portion of the power transmission information associated with the node captured through the electrical sensor to the at least one of the processing node and the central control node associated with the electrical network.

8. The method of claim 1, further comprising at least one of:
communicating between the electrical sensing device and the at least one of the processing node and the central control node based on a unique identification data associated with the electrical sensing device; and
programming the electrical sensing device with the unique identification data to enable the communication thereof with the at least one of the processing node and the central control node.

9. The method of claim 2, further comprising at least one of:
transmitting, from the wireless location sensor, a location information of the electrical sensor when the electrical sensor is queried; and
transmitting, from the wireless location sensor, the location information of the electrical sensor upon activating an appropriate communication sensor associated therewith.

10. The method of claim 2,
wherein the wireless location sensor is associated with a global positioning circuitry, and
wherein the method further comprises communicating a geospatial coordinate of at least one of the electrical sensor and the location of the at least one of the power outage and the sub-optimal performance in the node to the at least one of the processing node and the central control node through the wireless location sensor such that a location of an event associated with the node is determinable within at most 5 meters.

11. The method of claim 2, further comprising:
charging the power supply through the inductively coupling of the electrical sensor to the transmission line to enable the communication of the information associated with the location of the at least one of the power outage and the sub-optimal performance in the node to the at least one of the processing node and the central control node associated with the electrical network.

12. An electrical network comprising:
a plurality of nodes, each node of the plurality of nodes comprising a transmission line and an electrical sensing device inductively coupled to the transmission line, the electrical sensing device being configured to capture power transmission information associated with the node, and the electrical sensing device including an electrical sensor and a wireless location sensor associated therewith to transmit at least one of a location information associated with the node and a location information of the electrical sensing device;
a plurality of processing nodes; and
a central control node,
wherein at least one of a power outage and a sub-optimal performance in the electrical network is localized to a location within a node of the plurality of nodes based on the power transmission information captured through the electrical sensing device and the location information transmitted by the electrical sensing device in the each node of the plurality of nodes to at least one of a processing node and the central control node.

13. The electrical network of claim 12, wherein the electrical sensing device is powered through at least one of the inductive coupling thereof to the transmission line and a power supply associated therewith.

14. The electrical network of claim 12, wherein the power transmission information captured through the electrical sensor is associated with at least one of a current data, a voltage data, an oscillation data, a surge data, and a phase data.

15. The electrical network of claim 12, wherein the electrical sensing device includes an appropriate interface to at least one of:
process an input from an external sensor to the electrical sensor;
analyze an input from a utility meter; and
capture at least one of an audio data, an image data and a video data associated with an environment proximate the node.

16. The electrical network of claim 12, wherein at least one of:
the electrical sensing device is configured to determine a condition information associated with the node,
the electrical sensing device is configured to analyze status information received from and associated with at least one external sensor in proximity thereto; and
the electrical sensing device is configured to activate at least one of a light device and a sound device associated with at least one of the condition information of the node and the at least one external sensor.

17. The electrical network of claim 12, wherein the electrical sensing device is configured to one of periodically and continuously transmit at least a portion of the power transmission information associated with the node captured therethrough to the at least one of the processing node and the central control node.

18. The electrical network of claim 12, wherein at least one of:
the electrical sensing device and the at least one of the processing node and the central control node are configured to communicate based on a unique identification data associated with the electrical sensing device, and
the electrical sensing device includes an appropriate programming interface to program the electrical sensing device with the unique identification data to enable the communication with the at least one of the processing node and the central control node.

19. The electrical network of claim 12, wherein at least one of:
the electrical sensing device is configured to transmit the location information thereof when queried, and
the electrical sensing device includes an appropriate communication sensor associated therewith, which, when activated, enables the electrical sensing device to transmit the location information thereof.

20. The electrical network of claim 12,
wherein the wireless location sensor is associated with a global positioning circuitry, and
wherein the wireless location sensor is configured to communicate a geospatial coordinate of at least one of the electrical sensing device and the location of the at least one of the power outage and the sub-optimal performance in the node to the at least one of the processing node and the central control node such that a location of an event associated with the node is determinable within at most 5 meters.

21. The electrical network of claim 13, wherein the power supply is charged through the inductively coupling of the electrical sensing device to the transmission line to enable transmission of the at least one of the power outage and the sub-optimal performance within the node to the at least one of the processing node and the central control node.

22. An electrical sensing device comprising:
an electrical sensor configured to be inductively coupled to a transmission line associated with a node of an electrical network, and to capture power transmission information associated with the node; and
a wireless location sensor configured to capture a location information associated with the node,
wherein the electrical sensing device is configured to communicate information associated with a location of at least one of a power outage and a sub-optimal performance in the node to at least one of a processing node and a central control node associated with the electrical network.

23. The electrical sensing device of claim 22, wherein the electrical sensor is powered through at least one of the inductive coupling thereof to the transmission line and a power supply associated therewith.

24. The electrical sensing device of claim 22, wherein the power transmission information captured through the electrical sensor is associated with at least one of a current data, a voltage data, and a phase data.

25. The electrical sensing device of claim 22, further comprising an appropriate interface to at least one of:
process an input from an external sensor to the electrical sensor;
analyze an input from a utility meter; and
capture at least one of an audio data, an image data and a video data associated with an environment proximate the node of the electrical network.

26. The electrical sensing device of claim 22, further comprising an appropriate programming interface to program the electrical sensing device with a unique identification data,
wherein the electrical sensing device and the at least one of the processing node and the central control node are configured to communicate based on the unique identification data, and
wherein the programming interface further enables programming of at least one of the electrical sensor and the wireless sensor to perform one or more appropriate functions.

27. The electrical sensing device of claim 22, wherein at least one of:
the electrical sensing device is configured to transmit a location information thereof when queried, and
the electrical sensing device includes an appropriate communication sensor associated therewith, which, when activated, enables the electrical sensing device to transmit the location information thereof.

28. The electrical sensing device of claim 22,
wherein the wireless location sensor is associated with a global positioning circuitry, and
wherein the wireless location sensor is configured to communicate a geospatial coordinate of at least one of the electrical sensing device and the location of the at least one of the power outage and the sub-optimal performance in the node to the at least one of the processing node and the central control node of the electrical network such that a location of an event associated with the node is determinable within at most 5 meters.

29. The electrical sensing device of claim 23, wherein the power supply is charged through the inductive coupling of the electrical sensor to the transmission line to enable the communication of the information associated with the location of the at least one of the power outage and the sub-optimal performance in the node to the at least one of the processing node and the central control node associated with the electrical network.

* * * * *